United States Patent
Uy et al.

(10) Patent No.: US 10,575,381 B1
(45) Date of Patent: Feb. 25, 2020

(54) ELECTROLUMINESCENT DISPLAY ON SMART TEXTILE AND INTERCONNECT METHODS

(71) Applicant: Flex Ltd., Singapore (SG)

(72) Inventors: William Uy, San Jose, CA (US); Weifeng Liu, Dublin, CA (US); Dason Cheung, Fremont, CA (US); Jie Lian, San Jose, CA (US); Christian Biederman, Scotts Valley, CA (US); Anwar Mohammed, San Jose, CA (US); Murad Kurwa, San Jose, CA (US)

(73) Assignee: Flex Ltd., Singapore (SG)

( * ) Notice: Subject to any disclaimer, the term of this patent is extended or adjusted under 35 U.S.C. 154(b) by 18 days.

(21) Appl. No.: 15/995,906

(22) Filed: Jun. 1, 2018

(51) Int. Cl.
| | |
|---|---|
| *H05B 33/14* | (2006.01) |
| *G09G 3/30* | (2006.01) |
| *H05K 1/18* | (2006.01) |
| *H05B 33/10* | (2006.01) |
| *G06F 1/16* | (2006.01) |
| *H05B 33/28* | (2006.01) |

(52) U.S. Cl.
CPC ........ *H05B 33/14* (2013.01); *G06F 1/1652* (2013.01); *G09G 3/30* (2013.01); *H05B 33/10* (2013.01); *H05B 33/28* (2013.01); *H05K 1/189* (2013.01)

(58) Field of Classification Search
None
See application file for complete search history.

(56) References Cited

U.S. PATENT DOCUMENTS

| | | | |
|---|---|---|---|
| 4,492,949 A | 1/1985 | Peterson | |
| 4,774,530 A | 9/1988 | Hawkins | |
| 5,291,374 A | 3/1994 | Hirata | |
| 5,626,135 A | 5/1997 | Sanfilippo | |
| 5,739,254 A | 4/1998 | Fuller | |
| 5,761,809 A | 6/1998 | Fuller | |
| 5,762,812 A | 6/1998 | Narang | |
| 5,849,809 A | 12/1998 | Narang | |
| 5,856,029 A * | 1/1999 | Burrows | ........... H05B 33/04 |
| | | | 313/502 |
| 5,863,963 A | 1/1999 | Narang | |
| 5,945,253 A | 8/1999 | Narang | |
| 5,958,995 A | 9/1999 | Narang | |
| 5,994,425 A | 11/1999 | Narang | |
| 6,007,877 A | 12/1999 | Narang | |
| 6,124,372 A | 9/2000 | Smith | |
| 6,139,920 A | 10/2000 | Smith | |
| 6,260,956 B1 | 7/2001 | Narang | |
| 6,302,523 B1 | 10/2001 | Smith | |
| 6,370,034 B1 | 4/2002 | Busch | |
| 6,534,723 B1 | 3/2003 | Asai | |
| 6,964,205 B2 | 11/2005 | Papakostas | |

(Continued)

OTHER PUBLICATIONS

Non-Final Office Action dated Mar. 22, 2019, U.S. Appl. No. 15/249,024, filed Aug. 26, 2016, applicant:Michael James Glickman, Examiner: Davis-Hollington, Octavia L., dated Mar. 22, 2019, 22 pages.

*Primary Examiner* — Nicholas J Lee

(74) *Attorney, Agent, or Firm* — Haverstock & Owens LLP

(57) ABSTRACT

An electroluminescent display is flexible and stretchable, and therefore able to be attached to a textile. All interior layers of the electroluminescent display can be made using a screen printing process which can be scaled for volume production.

29 Claims, 3 Drawing Sheets

(56) References Cited

U.S. PATENT DOCUMENTS

| | | |
|---|---|---|
| 7,456,571 B1 | 11/2008 | Wedding |
| 7,578,195 B2 | 8/2009 | DeAngelis |
| 10,117,328 B1 | 10/2018 | Zhong |
| 2002/0018042 A1 | 2/2002 | Albert |
| 2003/0227079 A1 | 12/2003 | Chia |
| 2004/0009729 A1 | 1/2004 | Hill |
| 2004/0256725 A1 | 12/2004 | Inoue |
| 2005/0122700 A1 | 6/2005 | Kim |
| 2005/0231105 A1 | 10/2005 | Lovell |
| 2007/0096260 A1 | 5/2007 | Eshun |
| 2007/0215883 A1 | 9/2007 | Dixon |
| 2008/0018611 A1 | 1/2008 | Serban |
| 2008/0044127 A1 | 2/2008 | Leising |
| 2008/0139953 A1 | 6/2008 | Baker |
| 2009/0108270 A1 | 4/2009 | Chen |
| 2009/0257166 A1 | 10/2009 | Kim |
| 2009/0272197 A1 | 11/2009 | Ridao |
| 2010/0014265 A1 | 1/2010 | Sagisaka |
| 2010/0160762 A1 | 1/2010 | McLaughlin |
| 2010/0037497 A1 | 2/2010 | Anelevitz |
| 2010/0063365 A1 | 3/2010 | Pisani |
| 2010/0107770 A1 | 5/2010 | Serban |
| 2010/0185076 A1 | 7/2010 | Jeong |
| 2010/0277065 A1* | 11/2010 | Park .................. H05B 33/02 313/509 |
| 2011/0067904 A1 | 3/2011 | Aoyoma |
| 2011/0180306 A1 | 7/2011 | Naganuma |
| 2011/0180307 A1 | 7/2011 | Naganuma |
| 2011/0194262 A1 | 8/2011 | Naganuma |
| 2011/0198111 A1 | 8/2011 | Naganuma |
| 2011/0199739 A1 | 8/2011 | Naganuma |
| 2011/0203837 A1 | 8/2011 | Naganuma |
| 2012/0032224 A1 | 2/2012 | Fang |
| 2013/0019383 A1 | 1/2013 | Korkala |
| 2013/0038545 A1 | 2/2013 | Hsu |
| 2013/0060115 A1 | 3/2013 | Gehman |
| 2014/0117843 A1 | 5/2014 | Huffer |
| 2014/0124245 A1 | 5/2014 | Lai |
| 2014/0190727 A1 | 7/2014 | Lee |
| 2014/0343390 A1 | 11/2014 | Berzowska |
| 2015/0187863 A1 | 7/2015 | Zhu |
| 2015/0261057 A1 | 9/2015 | Harris |
| 2015/0366504 A1 | 12/2015 | Connor |
| 2016/0165723 A1 | 6/2016 | Romero |
| 2016/0183372 A1 | 6/2016 | Park |
| 2017/0042261 A1* | 2/2017 | Kull .................. A41D 13/01 |
| 2017/0099885 A1* | 4/2017 | Levy .................. G06F 1/1654 |
| 2017/0108459 A1 | 4/2017 | Katsuki |
| 2017/0150602 A1 | 5/2017 | Johnston |
| 2017/0172421 A1 | 6/2017 | Dabby |
| 2017/0358841 A1 | 12/2017 | Chen |
| 2017/0365644 A1 | 12/2017 | Zheng |
| 2018/0020563 A1 | 1/2018 | Hong |
| 2018/0070446 A1 | 3/2018 | Takahashi |

\* cited by examiner

ELECTROLUMINESCENT DISPLAY ON SMART TEXTILE AND INTERCONNECT METHODS

FIELD OF THE INVENTION

The present invention is generally directed to the field of displays. More specifically, the present invention is directed to an electroluminescent display attached to a smart textile and the method of interconnecting the two.

BACKGROUND OF THE INVENTION

Electroluminescence (EL) is an optical and electrical phenomenon where a material emits light in response to an electric current passing through it, or in response to being positioned within a strong electric field. Electroluminescent Displays (ELDs) are a type of display formed by sandwiching a layer of electroluminescent material, such as a phosphor based compound, between two layers of electrical conductors, or electrodes. When voltage is applied across the conductors, the layer of electroluminescent material emits radiation in the form of visible light.

Conventional ELDs are made of a first layer of flat, opaque electrodes formed on an insulating substrate. A layer of electroluminescent material is formed on the first electrode layer. A second layer of electrodes is formed over the electroluminescent material with the electrodes of the second layer selectively aligned with electrodes of the second layer. The second layer of electrodes is transparent in order to see light emitted from the underlying electroluminescent material. The insulating substrate is typically PET (polyethylene terephthalate) or glass, and the electroluminescent material is ITO (indium tin oxide). Such ELDs are expensive, substantially rigid, and non-stretchable.

SUMMARY OF THE INVENTION

Embodiments are directed to an electroluminescent display that is flexible and stretchable, and therefore able to be attached to a textile. In some embodiments, all interior layers of the electroluminescent display are made using a screen printing process which can be scaled for volume production.

In an aspect, an electroluminescent display is disclosed that includes a first insulting layer, a first conductive layer, an electroluminescent layer, one or more dielectric layers, a second conductive layer, a second insulating layer, a flexible circuit board, a textile, and a power supply. The first insulating layer is made of a flexible and stretchable material. The first conductive layer is coupled to the first insulating layer, wherein the first conductive layer is made of a transparent material. The electroluminescent layer is coupled to the first conductive layer, wherein the electroluminescent layer forms an electroluminescent pattern design. The one or more dielectric layers are coupled to the electroluminescent layer, wherein the one or more dielectric layers are made of a flexible and stretchable material. The second conductive layer is coupled to the one or more dielectric layers. The second insulating layer is coupled to the second conductive layer, wherein the second insulating layer is made of a flexible and stretchable material. The flexible circuit board is attached to the second insulating layer and electrically coupled to the first conductive layer and the second conductive layer. The second insulating layer is attached to the textile. The power supply is coupled to the flexible circuit board. In some embodiments, the first insulating layer is laminated to the second insulating layer with the first conductive layer, the electroluminescent layer, the one or more dielectric layers, and the second conductive layer are sandwiched between the laminated first insulating layer and second insulating layer. In some embodiments, the flexible circuit board is attached to a front side surface of the second insulating layer facing the second conductive layer such that the flexible circuit board is sandwiched between the laminated first insulating layer and second insulating layer. In some embodiments, the flexible circuit board is attached to a back side surface of the second insulating layer opposing the second conductive layer such that the flexible circuit board is sandwiched between the second insulating surface and the textile. In some embodiments, the second insulating material is attached to the textile by lamination, adhesive, stitching, or some combination of lamination, adhesive, and stitching. In some embodiments, the electroluminescent display also includes conductive interconnects coupling the flexible printed circuit board to the power supply. In some embodiments, the conductive interconnects are conductive yarn or conductive threads. In some embodiments, the first conductive layer forms a first continuous electrode and the second conductive layer forms a second continuous electrode, wherein the first conductive layer and the second conductive layer are coupled to the power supply to apply a voltage across the first electrode and the second electrode. In some embodiments, an entirety of the electroluminescent layer is aligned within a footprint of the first electrode and a footprint of the second electrode, further wherein when voltage is applied across the first electrode and the second electrode the entire electroluminescent layer emits light. In other embodiments, the first conductive layer forms a first conductive pattern design that matches the electroluminescent pattern design, and the second conductive layer forms a second conductive pattern design that matches the electroluminescent pattern design, wherein the first conductive layer and the second conductive layer are coupled to the power supply to apply a voltage across the first conductive pattern design and the second conductive pattern design. In some embodiments, an entirety of the electroluminescent pattern design, the first conductive pattern design, and the second conductive pattern design are aligned with each other. In some embodiments, the first conductive layer further comprises a first bus bar surrounding at least a portion of the first conductive pattern design, further wherein the first bus bar is coupled to the first conductive pattern design, and the flexible circuit board is coupled to the first conductive pattern design via the first bus bar, the second conductive layer further comprises a second bus bar surrounding at least a portion of the second conductive pattern design, further wherein the second bus bar is coupled to the second conductive pattern design, and the flexible circuit board is coupled to the second conductive pattern design via the second bus bar. In some embodiments, the first insulating layer and the second insulating layer are each made of a thermoplastic polyurethane film. In some embodiments, the first conductive layer and the second conductive layer are each made of conductive ink. In some embodiments, the conductive ink of the first conductive layer consists of one of PEDOT ink or ITO ink. In some embodiments, the conductive ink of the second conductive layer consists of one of silver ink or carbon ink. In some embodiments, the electroluminescent layer is made of phosphor ink.

In another aspect, a method of making an electroluminescent display is disclosed. The method includes printing a first conductive layer on a first insulating layer, wherein the first conductive layer is made of transparent material, and the first insulating layer is made of a flexible and stretchable material. The method also includes printing a patterned electroluminescent layer on the first conductive layer, printing one or more dielectric layers onto the patterned electroluminescent layer, wherein the one or more dielectric layers are made of a flexible and stretchable material. The method also includes printing a second conductive layer on the one or more dielectric layers, and applying a second insulating layer on the second conductive layer, wherein the second insulating layer is made of a flexible and stretchable material. The method also includes connecting a flexible circuit board to the first conductive layer and the second conductive layer, attaching the second insulating layer to a textile, and connecting the flexible circuit board to a power supply.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to an electroluminescent display. Those of ordinary skill in the art will realize that the following detailed description of the electroluminescent display is illustrative only and is not intended to be in any way limiting. Other embodiments of the electroluminescent display will readily suggest themselves to such skilled persons having the benefit of this disclosure.

Reference will now be made in detail to implementations of the electroluminescent display as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
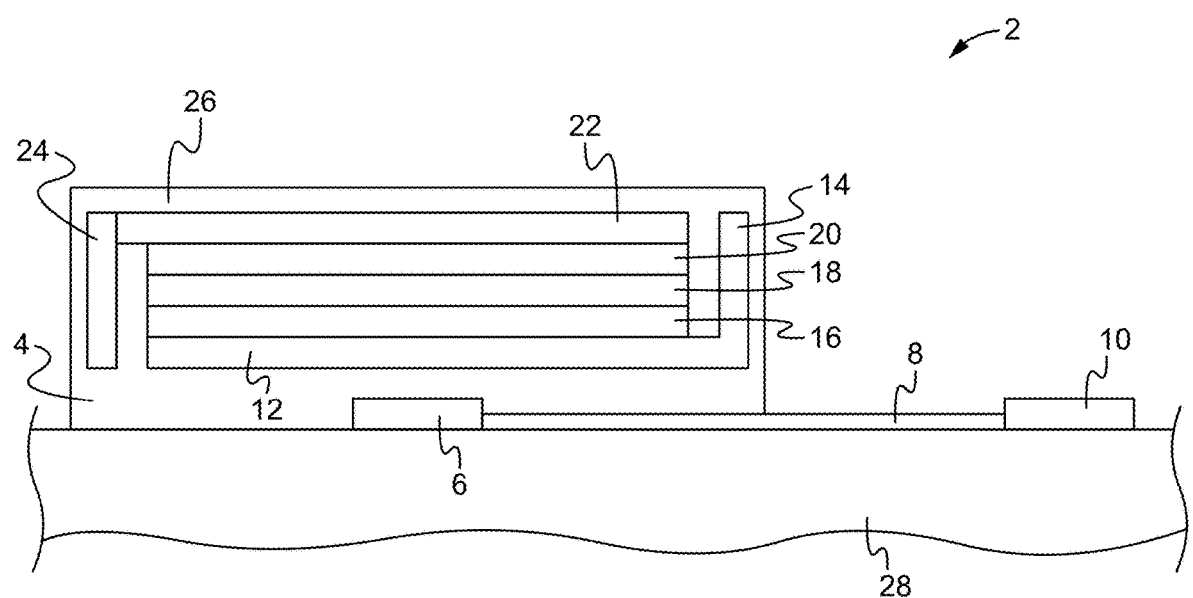
FIG. 1 illustrates a cut-out side view of an electroluminescent display according to an embodiment.

FIG. 1 illustrates a cut-out side view of an electroluminescent display according to an embodiment. The electroluminescent display 2 includes an insulating layer 4, a conductive layer 12, a bus bar 14, a dielectric layer 16, a dielectric layer 18, an electroluminescent layer 20, a conductive layer 22, a bus bar 24, and an insulating layer 26. The insulating layer 26 and the conductor layer 22 are each made of material that is transparent. Each of the insulating layers 4, 26, the conductive layers 12, 22, and the dielectric layers 16, 18 are made of materials that are flexible and stretchable. In some embodiments, the insulating layer 4 and the insulating layer 26 are each a TPU (thermoplastic polyurethane) film. In other embodiments, the insulating layers 4, 26 are made of other elastomers. It is understood that the insulating layer 4 can be made of alternative materials that are flexible and stretchable, and the insulting layer 26 can be made of alternative materials that are transparent, flexible, and stretchable. In some embodiments, the conductive layer 22 is made of material that is transparent, flexible, and stretchable. In some embodiments, the conductive layer 22 is made of PEDOT (Poly 3,4-Ethylenedioxythiophene) conductive ink that once applied and cured is flexible and stretchable. In other embodiments, the conductive layer 22 is made of or ITO (Indium-Tin-Oxide) conductive ink that is somewhat bendable (not fully flexible) but is not stretchable once applied and cured. In other embodiments, the conductive layer 22 is made of other transparent materials that are flexible and stretchable including, but not limited to, nano carbon tube and nano silver wire. In other embodiments, the conductive layer 22 is made of other transparent, conductive, flexible, and stretchable polymers, for example plastic doped with metal. It is understood that the conductive layer 22 can be made of alternative conductive materials that are transparent, conductive, flexible, and stretchable. In some embodiments, the conductive layer 12 is made of material that is transparent, flexible, and stretchable, such as any of the materials used to make the conductive layer 22. An example of such a material is silver ink. In other embodiments, the conductive layer 12 is made of flexible and stretchable material that is translucent or opaque. The bus bar 14 is an extension of the conductive layer 12 and is made of the same material. The bus bar 24 is either made of the same material as the conductive layer 12 and is connected to the conductive layer 22, or the bus bar 24 is an extension of the conductive layer 22 and is made of the same material. For example, if the conductive layer 12 is made of silver ink and the conductive layer 22 is made of ITO ink, then the bus bar 24 can be made of silver ink for enhanced resistance characteristics.

The dielectric layers 16, 18 are insulating layers between the conductive layers 12, 22. The electroluminescent layer 20 is made of a material that luminesces when subjected to electricity, such as an applied voltage. In some embodiments, the electroluminescent layer 20 is made of phosphor ink. In other embodiments, the electroluminescent layer 20 is made of a phosphor compound that includes different metals or alloys, such as ZnS-Phospor or CaS-Phosphor. It is understood that the electroluminescent layer 20 can be made of alternative materials that are electroluminescent.

A flexible circuit board 6 includes processing circuitry for controlling operation of the electroluminescent display. Power is supplied to the flexible printed circuit 6 by a battery 10 via conductive interconnects 8. In some embodiments, the conductive interconnects 8 are conductive yarn or other conductive threads.

In some embodiments, the flexible circuit board 6 is attached to an opposite side (back side) of the insulating layer 4 as the conductive layer 12. The insulating layer 4 is attached to a textile 28 with the flexible circuit board 6 and the conductive interconnects 8 sandwiched there between. The insulating layer 4 can be attached to the textile 28 by lamination, adhesive, stitching, or any combination. The flexible circuit board 6 is coupled to the bus bar 14 by a first conductive interconnect (not shown) and coupled to the bus bar 24 by a second conductive interconnect (not shown). The first conductive interconnect can be a conductive trace formed on the backside (same side as the flexible circuit board 6) of the insulating layer 4, which connects on one end to the flexible circuit board 6 and on another end to a hole formed in the insulating layer 4 proximate the bus bar 14. The hole is filled with a conductive material to form a conductive via. The filled hole is connected to the bus bar 14, either directly or via another conductive interconnect. The second conductive interconnect can be similarly formed and connected to the flexible circuit board 6 and another conductive material filled hole proximate the bus bar 24, the filled hole is connected to the bus bar 24 either directly or indirectly via another conductive interconnect. Alternatively, the first and second conductive interconnects can be a conductive yarn or other conductive threads.

In other embodiments, the flexible circuit board is attached to a same side of the insulating layer 4 as the conductive layer 12. In this case, the flexible circuit board is positioned outside the perimeter of the bus bars 14 and 24. First conductive interconnect can be a conductive yarn or conductive thread and attaches bus bar 14 to the flexible circuit board. Second conductive interconnect can be a conductive yarn or conductive thread and attaches bus bar 24 to the flexible circuit board. In this embodiment, there is no need for holes through the insulating layer 4.

The electroluminescent layer 20 is selectively formed according to a pattern design. For example, the electroluminescent layer 20 can be patterned into a company or product name or logo. A voltage is applied to the conductive layer 12 and the conductive layer 22. When voltage is applied across the conductive layer 12 and the conductive layer 22, the electroluminescent layer 20 emits light, and when voltage is not applied across the conductive layer 12 and the conductive layer 22, the electroluminescent layer 20 does not emit light. In this manner, the structure formed by the conductive layers 12, 22 and the dielectric layers 16, 18 functions similarly as a capacitor. As such, the dielectric layers 16, 18 are made of dielectric material having permittivity sufficiently high so that sufficient charge is generated to emit light from the electroluminescent material of the electroluminescent layer 20. In operation, voltage applied across the conductive layers 12 and 22 generates a charge that activates the luminescence of the electroluminescent material. Higher dielectric permittivity for the dielectric layers 16, 18 enables a lower applied voltage to generate sufficient charge to luminesce the electroluminescent material. In some applications, high AC voltage is used for the electroluminescent display. In a high AC voltage application, two dielectric layers function to minimize, if not prevent, dielectric breakdown or leakage current due to a pit hole in one dielectric layer. A second dielectric layer would ensures the defect (pit hole) is fixed to have good insulation. In other embodiments, a single dielectric layer can be used.

Figure 2:
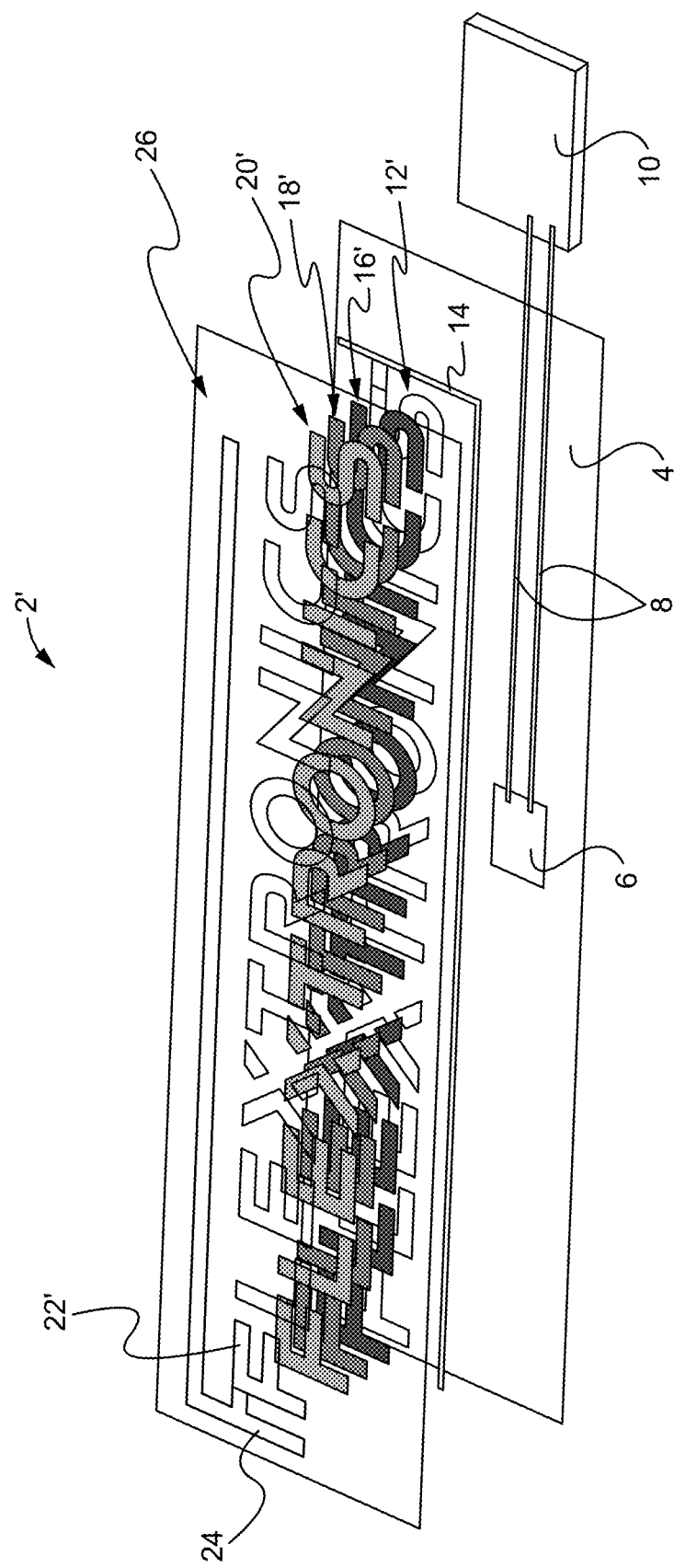
FIG. 2 illustrates an exploded perspective view of an electroluminescent display according to an embodiment.

In some embodiments, the conductive layers 12, 22 and the dielectric layers 16, 18 each form continuous, planar layers under and above (relative to the figure) the pattern design of the electroluminescent layer 20. In this case, there may not be a need for the bus bar 14, instead the filled hole connected to the first conductive interconnect can be connected to the conductive layer 12. In other embodiments, the conductive layers 12, 22 and the dielectric layers 16, 18 are each formed to match the pattern design of the electroluminescent layer 40, thereby saving materials and associated costs. FIG. 2 illustrates an exploded perspective view of an electroluminescent display according to an embodiment. The electroluminescent display 2' is the same as the electroluminescent display 2 of FIG. 1 except the electroluminescent layer 20' is shown to have a specific pattern design and the conductive layers 12', 22' and the dielectric layers 16', 18' are pattern designed to match the pattern design of the electroluminescent layer 20'.

Figure 3:
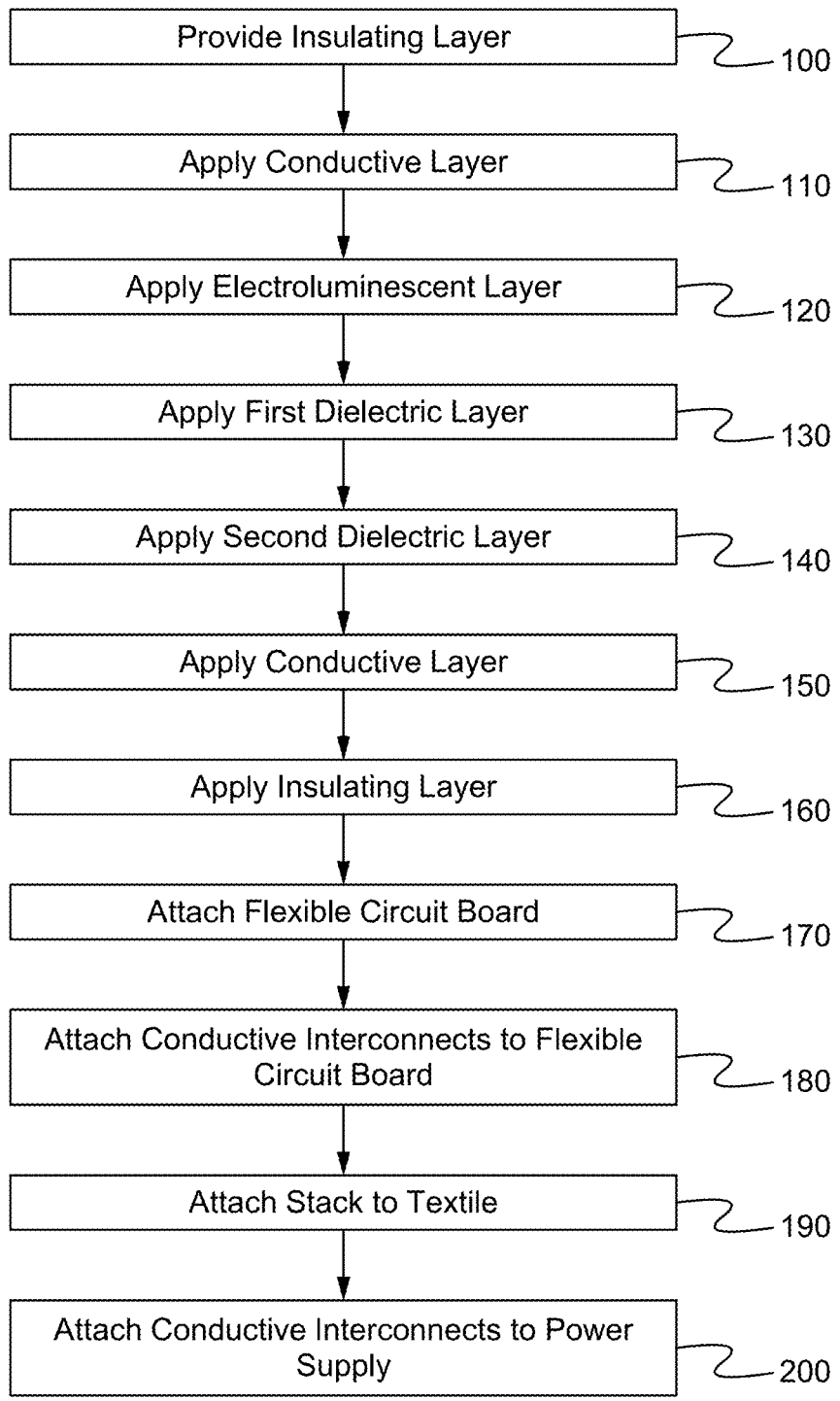
FIG. 3 illustrates a method of fabricating an electroluminescent display according to an embodiment.

Various processes can be used to fabricate the electroluminescent display. FIG. 3 illustrates a method of fabricating an electroluminescent display according to an embodiment. The method shown in FIG. 3 is shown and described in terms of the electroluminescent display 2' of FIG. 2. It is understood that the method steps can be generally applied to make alternatively configured electroluminescent displays. At the step 100, the insulating layer 26 is provided. At the step 110, the conductive layer 22' is applied on the insulating layer 26. The conductive layer 22' is formed according to a pattern design, in this case the pattern design forms the word "FLEXTRONICS". In some embodiments, the conductive layer 22' is printed, such as by screen printing, onto the insulating layer 26. The conductive layer 22' is then cured.

At the step 120, the electroluminescent layer 20' is applied on the conductive layer 22'. The electroluminescent layer 20' is formed according to the pattern design. In some embodiments, the electroluminescent layer 20' is printed, such as by screen printing, onto the conductive layer 22'. The electroluminescent layer 20' is then cured.

At the step 130, the dielectric layer 16' is applied over the electroluminescent layer 20'. The dielectric layer 16' is formed according to the pattern design. In some embodiments, the dielectric layer 16' is printed, such as by screen printing, over the electroluminescent layer 20'. The dielectric layer 16' is then cured.

At the step 140, the dielectric layer 18' is applied on the dielectric layer 16'. The dielectric layer 18' is formed according to the pattern design. In some embodiments, the dielectric layer 18' is printed, such as by screen printing, over the dielectric layer 16'. The dielectric layer 18' is then cured.

At the step 150, the conductive layer 12' is applied on the dielectric layer 18'. The conductive layer 12' is formed according to the pattern design. The bus bar 24 is applied to the insulating layer 26 including an interconnect to conductive layer 22'. The bus bar 14 is applied to the insulating layer 26 including an interconnect to conductive layer 12'. In some embodiments, the conductive layer 12' is printed, such as by screen printing, onto the dielectric layer 18'. In some embodiments, the bus bar 14 and the bus bar 24 are each printed, such as by screen printing, onto the insulating layer 26. The conductive layer 12', the bus bar 14, and the bus bar 24 are then cured.

At the step 160, the insulating layer 4 is applied on the conductive layer 12'. In some embodiments, the insulating layer 4 has preformed holes. The holes are filled with a conductive material making the filled holes conductive vias from one surface of the insulating layer 4 to the other surface. The holes can either be pre-filled prior to application of the insulating layer 4 to the conductive layer 12', or after application of the insulating layer 4 to the conductive layer 12'. In some embodiments, there is a hole aligned with and coupled to each bus bar 14, 24. In some embodiments, first conductive interconnect and second conductive interconnect are formed on the surface (back side) of the insulating layer 4 opposing the conductive layer 12'. The first conductive interconnect is connected to the filled hole aligned with bus bar 14, and the second conductive interconnect is connected to the filled hole aligned with bus bar 24. The first conductive interconnect and the second conductive interconnect can be formed on the insulating layer 4 prior to application of the insulating layer 4 to the conductive layer 12', or formed on the insulating layer 4 after application of the insulating layer 4 to the conductive layer 12'. In some embodiments, the stack up is laminated such that insulating layer 4 is laminated to insulating layer 26 to fully enclose the conductive layers 12', 20', dielectric layers 16', 18', and the electroluminescent layer 20' there between.

At the step 170, the flexible circuit board 6 is attached to the back side of the insulating layer 4. In some embodiments, the flexible circuit board 6 is aligned with the insulating layer 4 such that contact pads on the flexible circuit board 6 are aligned with the first conductive interconnect and the second conductive interconnect thereby forming interconnections. A conductive adhesive can be used to attach the first and second conductive interconnects to the corresponding contact pads. In other embodiments, the first and second conductive interconnects are not formed and instead the conductive vias (filled holes) in the insulating layer 4 are positioned to align with corresponding contact pads on flexible circuit board 6, and attaching the flexible circuit board 6 to the backside of the insulating layer 4 includes aligning the flexible circuit board 6 with the insulating layer 4 such that the conductive vias are coupled to the contact pads on the flexible circuit board 6 thereby forming an interconnection between the flexible circuit board 6 and the bus bars 14, 24.

At the step 180, the conductive interconnects 8 are attached to the flexible circuit board 6. In some embodiments, the conductive interconnects 8 are formed of conductive yarn or other conductive threads.

At the step 190, the laminated stack is attached to the textile, such as textile 28 in FIG. 1. Specifically, the insulating layer 4 is attached to the textile. Ends of the conductive interconnects 8 extend beyond a footprint of the laminated stack. The laminated stack can be attached to the textile by lamination, adhesive, stitching, or some combination.

At the step 200, the exposed ends of the conductive interconnects 8 are attached to the battery 10.

It is understood that the various steps described above can be combined or rearranged.

In the case where the flexible circuit board 6 is attached to the same side (front side) of the insulating layer 4 as the conductive layer 12', the various method steps can be rearranged and modified. In this alternative configuration, the flexible circuit board 6 is connected to the bus bar 14 and the bus bar 24 after the step 150 and prior to application of the insulating layer 26. In this case, the flexible circuit board 6 is attached to the insulating layer 26, outside a perimeter of the bus bars 14 and 24. The flexible circuit board 6 can be attached to the bus bar 14 and the bus bar 24 using conductive yarn or other conductive thread, or using conductive interconnects applied to the insulating layer 26 and connected to the bus bars 14, 24. Then, conductive interconnects 8 for interconnecting the flexible circuit board 6 and the battery 4 are attached to the flexible circuit board 6. Then, the insulating layer 4 is laminated to the insulating layer 26 with the various other layers sandwiched there between. Then, the insulating layer 4 is attached to the textile as described above.

Although the method of FIG. 3 is described in terms of the electroluminescent display 2', it is understood that the method can be similarly applied to those electroluminescent displays where the conductive layers and dielectric layers are formed as planar layers instead of pattern designed to match that of the electroluminescent layer.

The present application has been described in terms of specific embodiments incorporating details to facilitate the understanding of the principles of construction and operation of the electroluminescent display. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electroluminescent display comprising:
   a. a first insulating layer made of a flexible and stretchable material;
   b. a first conductive layer coupled to the first insulating layer, wherein the first conductive layer is made of a transparent material;
   c. an electroluminescent layer coupled to the first conductive layer, wherein the electroluminescent layer forms an electroluminescent pattern design;
   d. one or more dielectric layers coupled to the electroluminescent layer, wherein the one or more dielectric layers are made of a flexible and stretchable material;
   e. a second conductive layer coupled to the one or more dielectric layers;
   f. a second insulating layer coupled to the second conductive layer, wherein the second insulating layer is made of a flexible and stretchable material;
   g. a flexible circuit board attached to the second insulating layer and electrically coupled to the first conductive layer and the second conductive layer;
   h. a textile, wherein the second insulating layer is attached to the textile; and
   i. a power supply coupled to the flexible circuit board,
   wherein the first insulating layer is laminated to the second insulating layer with the first conductive layer, the electroluminescent layer, the one or more dielectric layers, and the second conductive layer are sandwiched between the laminated first insulating layer and second insulating layer, and
   further wherein the flexible circuit board is attached to a front side surface of the second insulating layer facing the second conductive layer such that the flexible circuit board is sandwiched between the laminated first insulating layer and second insulating layer.

2. The electroluminescent display of claim 1 wherein the second insulating material is attached to the textile by lamination, adhesive, stitching, or some combination of lamination, adhesive, and stitching.

3. The electroluminescent display of claim 1 further comprising conductive interconnects coupling the flexible printed circuit board to the power supply.

4. The electroluminescent display of claim 3 wherein the conductive interconnects are conductive yarn or conductive threads.

5. The electroluminescent display of claim 1 wherein the first conductive layer forms a first continuous electrode and the second conductive layer forms a second continuous electrode, wherein the first conductive layer and the second conductive layer are coupled to the power supply to apply a voltage across the first electrode and the second electrode.

6. The electroluminescent display of claim 5 wherein an entirety of the electroluminescent layer is aligned within a footprint of the first electrode and a footprint of the second electrode, further wherein when voltage is applied across the first electrode and the second electrode the entire electroluminescent layer emits light.

7. The electroluminescent display of claim 1 wherein the first conductive layer forms a first conductive pattern design that matches the electroluminescent pattern design, and the second conductive layer forms a second conductive pattern design that matches the electroluminescent pattern design, wherein the first conductive layer and the second conductive layer are coupled to the power supply to apply a voltage across the first conductive pattern design and the second conductive pattern design.

8. The electroluminescent display of claim 7 wherein an entirety of the electroluminescent pattern design, the first conductive pattern design, and the second conductive pattern design are aligned with each other.

9. The electroluminescent display of claim 7 wherein the first conductive layer further comprises a first bus bar surrounding at least a portion of the first conductive pattern design, further wherein the first bus bar is coupled to the first conductive pattern design, and the flexible circuit board is coupled to the first conductive pattern design via the first bus bar, the second conductive layer further comprises a second bus bar surrounding at least a portion of the second conductive pattern design, further wherein the second bus bar is coupled to the second conductive pattern design, and the flexible circuit board is coupled to the second conductive pattern design via the second bus bar.

10. The electroluminescent display of claim 1 wherein the first insulating layer and the second insulating layer are each made of a thermoplastic polyurethane film.

11. The electroluminescent display of claim 1 wherein the first conductive layer and the second conductive layer are each made of conductive ink.

12. The electroluminescent display of claim 11 wherein the conductive ink of the first conductive layer consists of one of PEDOT ink or ITO ink.

13. The electroluminescent display of claim 11 wherein the conductive ink of the second conductive layer consists of one of silver ink or carbon ink.

14. The electroluminescent display of claim 1 wherein the electroluminescent layer is made of phosphor ink.

15. A method of making an electroluminescent display, the method comprising:
   a. printing a first conductive layer on a first insulating layer, wherein the first conductive layer is made of transparent material, and the first insulating layer is made of a flexible and stretchable material;
   b. printing a patterned electroluminescent layer on the first conductive layer;
   c. printing one or more dielectric layers onto the patterned electroluminescent layer, wherein the one or more dielectric layers are made of a flexible and stretchable material;
   d. printing a second conductive layer on the one or more dielectric layers;
   e. applying a second insulating layer on the second conductive layer, wherein the second insulating layer is made of a flexible and stretchable material;
   f. connecting a flexible circuit board to the first conductive layer and the second conductive layer;
   g. attaching the second insulating layer to a textile; and
   h. connecting the flexible circuit board to a power supply, wherein the first insulating layer is laminated to the second insulating layer with the first conductive layer, the electroluminescent layer, the one or more dielectric layers, and the second conductive layer are sandwiched between the laminated first insulating layer and second insulating layer, and further wherein the flexible circuit board is attached to a front side surface of the second insulating layer facing the second conductive layer such that the flexible circuit board is sandwiched between the laminated first insulating layer and second insulating layer.

16. An electroluminescent display comprising:
   a. a first insulating layer made of a flexible and stretchable material;
   b. a first conductive layer coupled to the first insulating layer, wherein the first conductive layer is made of a transparent material;
   c. an electroluminescent layer coupled to the first conductive layer, wherein the electroluminescent layer forms an electroluminescent pattern design;
   d. one or more dielectric layers coupled to the electroluminescent layer, wherein the one or more dielectric layers are made of a flexible and stretchable material;
   e. a second conductive layer coupled to the one or more dielectric layers;
   f. a second insulating layer coupled to the second conductive layer, wherein the second insulating layer is made of a flexible and stretchable material;
   g. a flexible circuit board attached to the second insulating layer and electrically coupled to the first conductive layer and the second conductive layer;
   h. a textile, wherein the second insulating layer is attached to the textile; and
   i. a power supply coupled to the flexible circuit board,
   wherein the first insulating layer is laminated to the second insulating layer with the first conductive layer, the electroluminescent layer, the one or more dielectric layers, and the second conductive layer are sandwiched between the laminated first insulating layer and second insulating layer, and
   further wherein the flexible circuit board is attached to a back side surface of the second insulating layer opposing the second conductive layer such that the flexible circuit board is sandwiched between the second insulating surface and the textile.

17. The electroluminescent display of claim 16 wherein the second insulating material is attached to the textile by lamination, adhesive, stitching, or some combination of lamination, adhesive, and stitching.

18. The electroluminescent display of claim 16 further comprising conductive interconnects coupling the flexible printed circuit board to the power supply.

19. The electroluminescent display of claim 18 wherein the conductive interconnects are conductive yarn or conductive threads.

20. The electroluminescent display of claim 16 wherein the first conductive layer forms a first continuous electrode and the second conductive layer forms a second continuous electrode, wherein the first conductive layer and the second conductive layer are coupled to the power supply to apply a voltage across the first electrode and the second electrode.

21. The electroluminescent display of claim 20 wherein an entirety of the electroluminescent layer is aligned within a footprint of the first electrode and a footprint of the second electrode, further wherein when voltage is applied across the first electrode and the second electrode the entire electroluminescent layer emits light.

22. The electroluminescent display of claim 16 wherein the first conductive layer forms a first conductive pattern design that matches the electroluminescent pattern design, and the second conductive layer forms a second conductive pattern design that matches the electroluminescent pattern design, wherein the first conductive layer and the second conductive layer are coupled to the power supply to apply a voltage across the first conductive pattern design and the second conductive pattern design.

23. The electroluminescent display of claim 22 wherein an entirety of the electroluminescent pattern design, the first conductive pattern design, and the second conductive pattern design are aligned with each other.

24. The electroluminescent display of claim 22 wherein the first conductive layer further comprises a first bus bar surrounding at least a portion of the first conductive pattern design, further wherein the first bus bar is coupled to the first conductive pattern design, and the flexible circuit board is coupled to the first conductive pattern design via the first bus bar, the second conductive layer further comprises a second bus bar surrounding at least a portion of the second conductive pattern design, further wherein the second bus bar is coupled to the second conductive pattern design, and the flexible circuit board is coupled to the second conductive pattern design via the second bus bar.

25. The electroluminescent display of claim 16 wherein the first insulating layer and the second insulating layer are each made of a thermoplastic polyurethane film.

26. The electroluminescent display of claim 16 wherein the first conductive layer and the second conductive layer are each made of conductive ink.

27. The electroluminescent display of claim 26 wherein the conductive ink of the first conductive layer consists of one of PEDOT ink or ITO ink.

28. The electroluminescent display of claim 26 wherein the conductive ink of the second conductive layer consists of one of silver ink or carbon ink.

29. The electroluminescent display of claim 16 wherein the electroluminescent layer is made of phosphor ink.

* * * * *